United States Patent
Pederson

(10) Patent No.: US 7,345,506 B1
(45) Date of Patent: Mar. 18, 2008

(54) REDUNDANCY METHOD AND SOFTWARE TO PROVIDE IMPROVED INTERCONNECT EFFICIENCY FOR PROGRAMMABLE LOGIC DEVICES

(75) Inventor: Bruce B. Pederson, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 50 days.

(21) Appl. No.: 11/476,239

(22) Filed: Jun. 27, 2006

(51) Int. Cl.
*H03K 19/177* (2006.01)

(52) U.S. Cl. ............................. 326/38; 326/41; 326/10

(58) Field of Classification Search ............ 326/37–41, 326/47, 10
See application file for complete search history.

(56) References Cited

U.S. PATENT DOCUMENTS

| | | | |
|---|---|---|---|
| 6,201,404 B1 | 3/2001 | Reddy et al. | |
| 6,344,755 B1 | 2/2002 | Reddy et al. | |
| 6,545,501 B1 * | 4/2003 | Bailis et al. | 326/10 |
| 6,826,741 B1 * | 11/2004 | Johnson et al. | 716/12 |
| 2003/0072185 A1 | 4/2003 | Lane et al. | |
| 2005/0264318 A1 | 12/2005 | Chan | |

* cited by examiner

*Primary Examiner*—James H. Cho
(74) *Attorney, Agent, or Firm*—Beyer Weaver LLP

(57) ABSTRACT

A method and computer readable medium for implementing redundancy on a programmable logic device with improved interconnect efficiency. The method and medium includes: determining if a first wire segment of a first wire channel requires a programmed connection to a resource in the row furthest from the buffer driving the first wire segment and spanned by the first wire segment; reserving a next segment in the first channel if the first wire segment of the first wire channel requires a programmed connection to a resource in the row furthest from the buffer driving the first wire segment and spanned by the first wire segment; and assuming a maximum delay path including the programmable signal propagation delay of the reserved next segment and a stitching element coupled between the first segment and the reserved next segment of the first channel.

16 Claims, 6 Drawing Sheets

REDUNDANCY METHOD AND SOFTWARE TO PROVIDE IMPROVED INTERCONNECT EFFICIENCY FOR PROGRAMMABLE LOGIC DEVICES

BACKGROUND

1. Field of the Invention

The present invention generally relates to programmable logic devices, and more particularly, to a software redundancy method and module for use in the programming software used to program programmable logic devices and which provides improved interconnect efficiency on the programmable logic device.

2. Description of Related Art

A Programmable Logic Device (PLD) is a semiconductor integrated circuit that contains fixed logic circuitry that can be programmed to perform a host of logic functions. In the semiconductor industry, PLDs are becoming increasingly popular for a number of reasons. Due to the advances of chip manufacturing technology, application specific integrated circuits (ASICs) designs have become incredibly complex. This complexity not only adds to design costs, but also the duration of time needed to develop an application specific design. To compound this problem, product life cycles are shrinking rapidly. As a result, it is often not feasible for original equipment manufacturers (OEMs) to design and use ASICs. OEMs are therefore relying more and more on PLDs. The same advances in fabrication technology have also resulted in PLDs with improved density and speed performance. Sophisticated programming software enables complex logic functions to be rapidly developed for PLDs. Furthermore, logic designs generally can also be easily migrated from one generation of PLDs to the next, further reducing product development times. The closing of the price-performance gap with ASICs and reduced product development times makes the use of PLDs compelling for many OEMs.

The architecture of most commercially available PLDs contain a two-dimensional array of logic blocks. A series of row and column interconnects, typically of varying length and speed, provide signal and clock interconnects between blocks of logic on the PLD. The basic building blocks of logic are often referred to by such names as Logic Elements or Adaptive Logic Modules (ALMs) by the Altera Corporation, assignee of the present application, or Complex Logic Blocks (CLBs), as described by Xilinx Corporation. In the Altera architectures, the LEs or ALMs are organized into groups referred to as Logic Array Blocks or LABs. With the Xilinx architecture, multiple CLBs are organized into a slice. The LEs, ALMS and CLBs each typically include such elements as look up tables (LUTs), registers for generating registered logic outputs, adders and other circuitry to implement various logic and arithmetic functions. For the sake of simplicity, any block of logic containing multiple LEs, ALMs or CLBs, regardless if organized into a LAB or a slice, are hereafter generically referred to as LABs. In no way should the term LAB be construed as limiting to a particular PLD architecture and is intended to cover the blocks of logic as implemented on commercially offered devices such as those offered by Altera, Xilinx as described above, or any other vendor.

The interconnect of many commercially available PLDs includes at least two levels. A so called global interconnect provides the routing of signals between LABs. A second, lower level interconnect, provides the routing of signals within a given LAB. The global interconnect typically includes a plurality of horizontal and vertical channels or lines running the width and height of the chip respectively. Each channel is divided into buffered segments. The length of each segment is measured in terms of the number of LABs it spans. For example, if a vertical channel is buffered every fourth LAB, then the segment is designated as a V4 segment. Similarly, a horizontal segment that spans four LABs is designated as an H4 segment. The buffers are provided to boost the strength of a signal traversing the segments of a channel. A switching multiplexer is also typically associated with each buffer. The combination of the switching multiplexer and the buffer allow a line segment to be "stitched" or driven by the previous line segment in its own or some other channel. The combination also allows a line segment to be driven by an orthogonal line segment or an LE from an adjacent LAB.

Large programmable logic devices often have manufacturing defects. To increase yield, programmable redundancy can be applied to repair some of these manufacturing defects. This is typically done by adding one or more redundant "rows" per device. If a defect occurs in one of the rows, the defective row is disabled and all of the rows between the defective row and the redundant row are logically shifted over one row to physically bypass and logically remove the defective row from the device. This is accomplished by shifting the programming data for each row to the adjacent row.

With redundancy however, the vertical routing segments must configured to span a defective row in the event redundancy is implemented. With this vertical routing constraint, each "NV" long vertical routing segment, where N equals the number of LABs spanned by the segment between buffers, actually has to span a total of N+1 LABs. For example, a "V4" segment actually spans five LABs. The additional height or length is often referred to as a "redundancy tail" and is required to drive the N+1 LAB in the shifted row when redundancy is implemented.

Programming software is used to develop the logic designs that are to be implemented on PLD devices. The design flow of a typical programming software package generally includes design entry, synthesis, place and route, timing analysis, simulation and finally the configuration of the PLD device. A user will typically enter a logic design using a high level language such as Verilog or VHDL. Once the logic design has been entered, a gate level netlist is extracted from Verilog or VHDL. In the synthesis step, the netlist is broken down and implemented into the actual hardware resources available on the PLD device. The place and route module arranges the necessary hardware resource to implement the design on the device as efficiently as possible. Thereafter, the design is simulated and timing analysis is performed. Any modifications to the design to meet timing or performance specifications are typically identified and corrected at this stage. Once the design is finalized, the programming software next converts the output of the place and route module into a programming file. The programming contains the individual bits used to configure or program the hardware on the PLD to implement the intended logic design on the device.

The problem with the aforementioned redundancy scheme is the tails required to span the N+1 LAB for redundancy require a separate physical metal trace on the chip. The extra trace is therefore overhead that reduces the number of row and/or column channels that could otherwise be implemented within the device architecture. The interconnect efficiency on the PLD is therefore adversely effected by the use of redundancy on the device.

A software redundancy method and module for use in the programming software used to program programmable logic devices and which provides improved interconnect efficiency on the programmable logic device is therefore needed.

SUMMARY OF THE INVENTION

A method and computer readable medium for implementing redundancy on a programmable logic device with improved interconnect efficiency. The method and medium is intended to be used on a programmable logic device having a plurality of programmable resources arranged in rows and interconnected by first wire channels running perpendicular to the rows. Second wire channels are also provided on the device running perpendicular to the first wire channels. Each of the first wire channel includes a plurality of wire segments driven by a buffer and spans one or more of the rows. A programmable stitching element is used selectively stitch a first wire segment to the next wire segment in the same wire channel. The method and medium includes (i) determining if a first wire segment of a first wire channel requires a programmed connection to a resource in the row furthest from the buffer driving the first wire segment and spanned by the first wire segment; (ii) reserving a next segment in the first channel if the first wire segment of the first wire channel requires a programmed connection to a resource in the row furthest from the buffer driving the first wire segment and spanned by the first wire segment; and (iii) assuming a maximum delay path including the programmable signal propagation delay of the reserved next segment and a stitching element coupled between the first segment and the reserved next segment of the first channel.

BRIEF DESCRIPTION OF THE DRAWINGS

The invention may best be understood by reference to the following description taken in conjunction with the accompanying drawings, which illustrate specific embodiments of the present invention.

It should be noted that like reference numbers refer to like elements in the figures.

DETAILED DESCRIPTION OF SPECIFIC EMBODIMENTS

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as programmable devices and application-specific integrated circuit (ASIC) devices.

Figure 1:
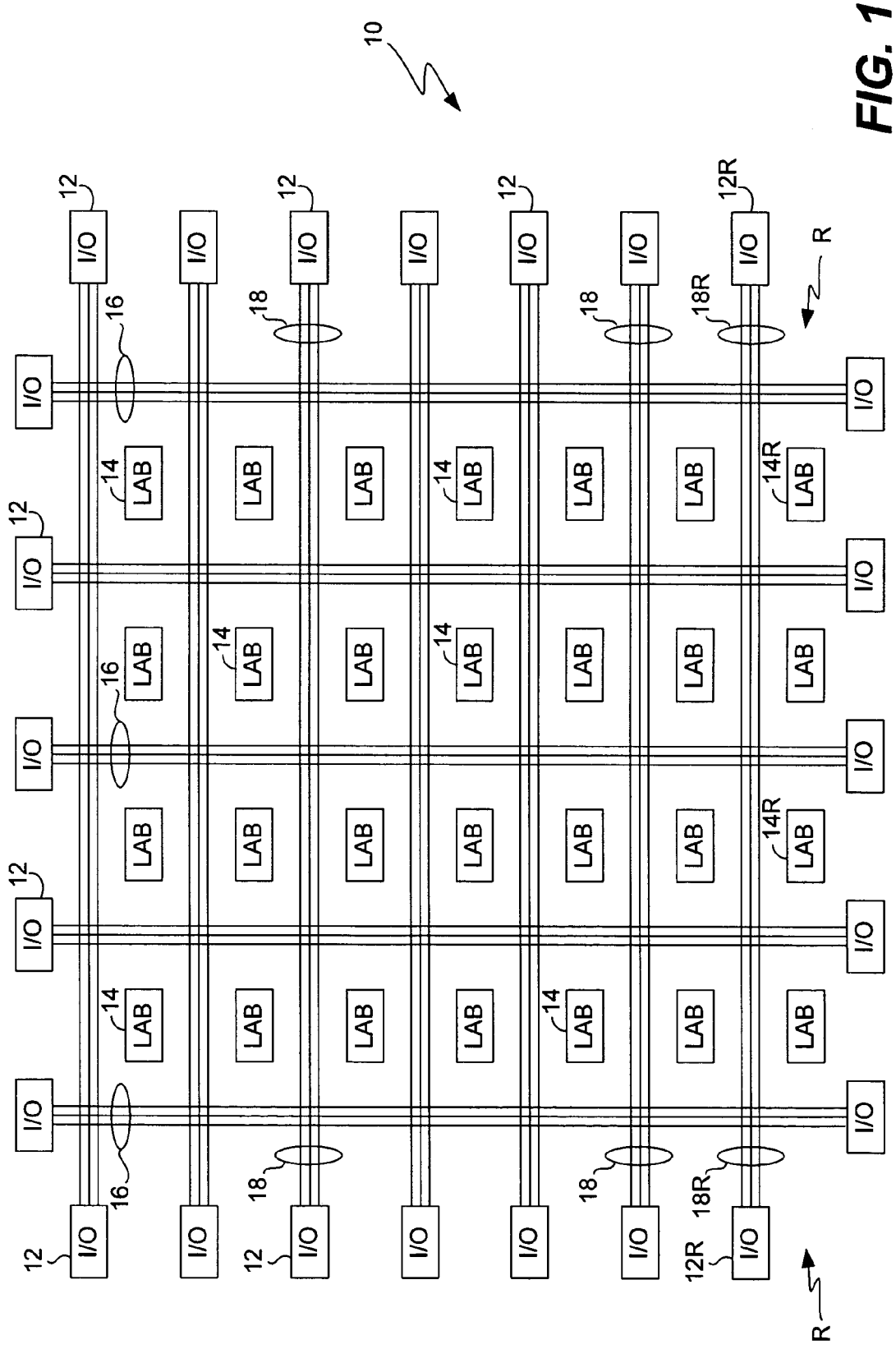
FIG. 1 is a block diagram of a Programmable Logic Device (PLD) of the present invention.

Referring to FIG. 1, a block diagram of a Programmable Logic Device (PLD) of the present invention is shown. The PLD 10 includes a two dimensional row and column based architecture including a plurality of Input/Output elements (IOEs) 12 arranged around the periphery of the chip, a plurality of Logic Array Blocks (LABs) 14 arranged in row and column array lines on the device, a first plurality of vertical array channel interconnects 16 and a second plurality of horizontal array channel interconnects 18. The PLD 10 also includes at the bottom of the array a redundant row line designated by the letter "R" and including redundant LABs 14R and associated IOE elements 12R and horizontal array channels 18R.

It should be noted that the PLD 10 is merely exemplary and in no way should be construed as limiting the invention. For more information on the specific PLD architecture 10 illustrated in FIG. 1, see for example the Stratix II Architecture, Functional Description, pages 2-1 through 2-104, from the Altera Corporation "Stratix II Device Handbook", Volume 1, May, 2005, or the Stratix Architecture, Version 3.3, July, 2005, both incorporated by reference herein for all purposes. The present invention, however, as described in detail below can be implemented in any type of programmable logic device that provides redundancy for blocks of logic arranged in an array.

Figure 2:
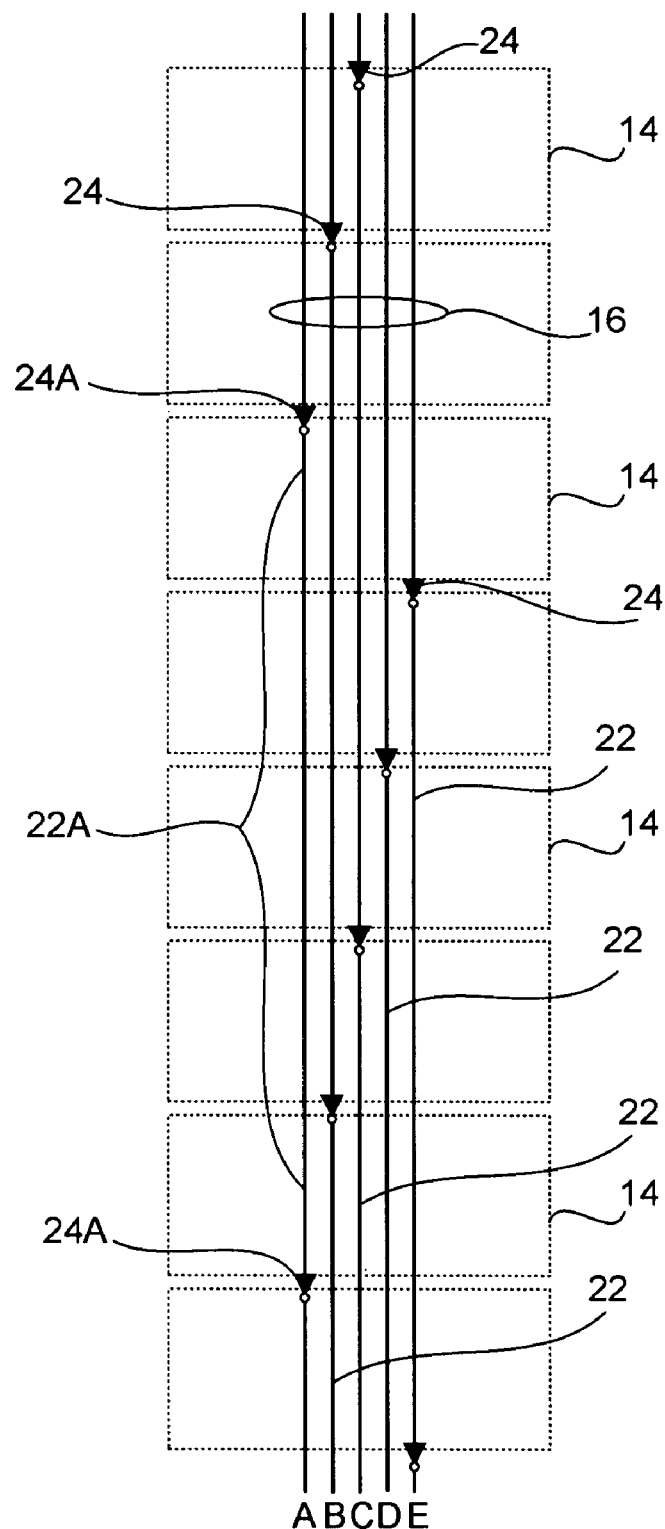
FIG. 2 illustrates a plurality of vertical channel interconnects used in PLDs according to the prior art.

Referring to FIG. 2, a plurality of vertical channel interconnects 16 used in a known PLD is shown. With this arrangement, each of the individual channel interconnects (designated A, B, C, D, and E) are broken down into segments 22. Each segment 22 spans a number of LABs 14 and is defined by a pair of buffers 24. For example with the A channel, two buffers 24A defined a segment 22A that spans a plurality of LABs 14. It should be noted that the location of the buffers 24 along each channel A, B, C, D and E are staggered so that the individual segments 22 of each channel are also staggered relative to one another. By staggering the location of the buffers 24, the pitch of the vertical channel interconnects can be reduced. It should be noted that the buffers 24 are sometimes referred to as stitching buffers because they "stitch" together the individual segments 22 of a channel.

Figure 3:
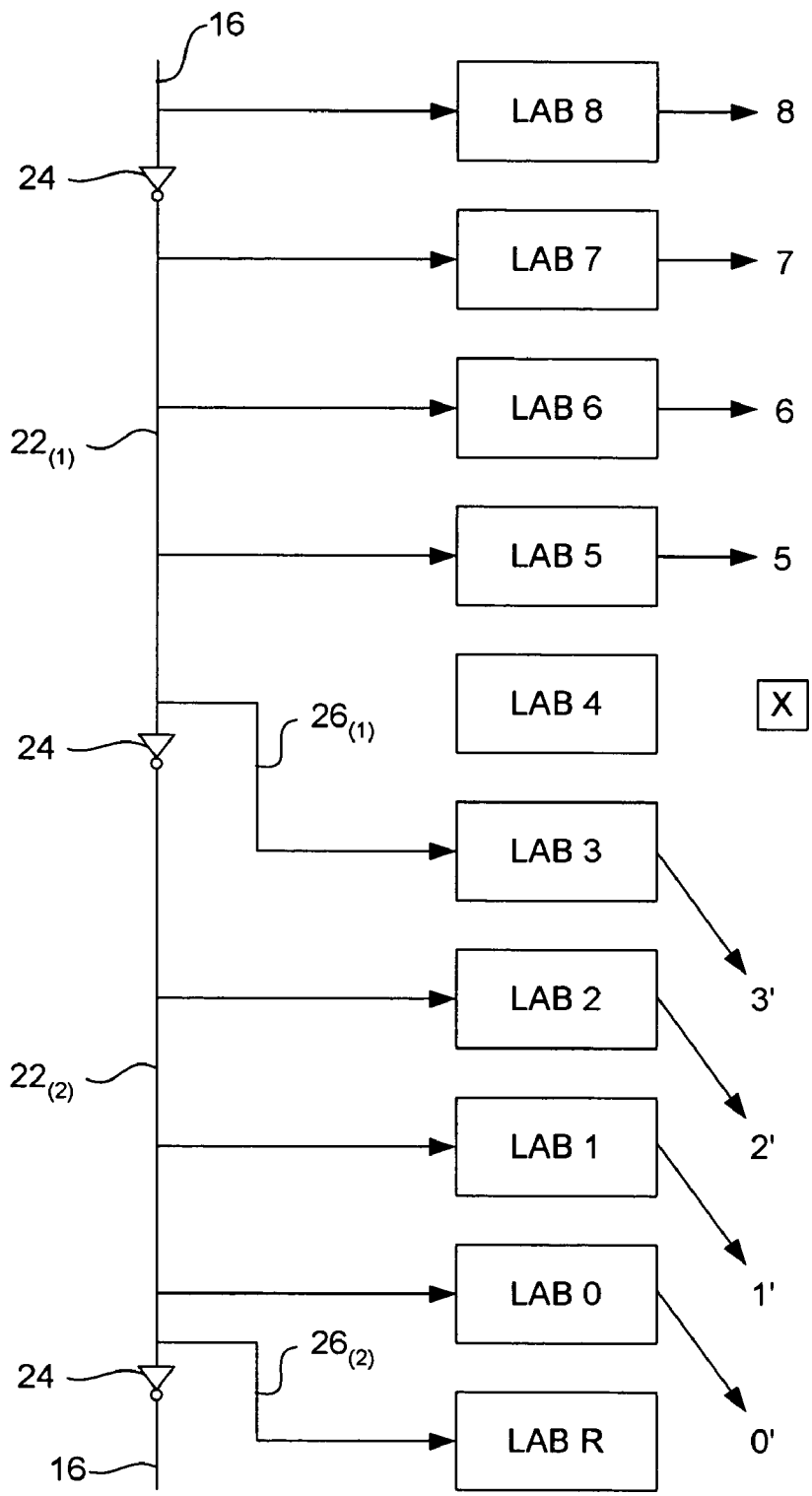
FIG. 3 illustrates the implementation of row redundancy in a PLD according to one known implementation.

Referring to FIG. 3, a diagram illustrating the implementation of row redundancy in the known PLD is shown. For the sake of simplicity, only a single vertical channel interconnect 16 is shown. The vertical channel 16 spans a total of nine row lines of the array, as designated by "LAB 8" through "LAB 0" and one redundant LAB row designated as "LAB R" The channel 16, as noted above includes a number of buffered segments 22. In the example shown, a segment $22_{(1)}$ spans LAB 7 through LAB 4 and includes a tail $26_{(1)}$ that spans to LAB 3. Similarly, a second segment $22_{(2)}$ spans LABs 3 through LAB 0 and includes a tail that spans to the redundant LAB R. Since the segments 22 span four LABs, they are designated as "V4" segments or lines.

FIG. 3 is useful for illustrating the prior art method of implementing redundancy. In the example illustrated, the "X" next to "LAB 4" indicates that row 4 in the array has been designated as defective. When implementing redundancy, the row containing LAB 4 needs to be logically removed from the array and replaced. This is accomplished by physically shifting the inputs from the vertical channels 16 intended for LAB 4 through LAB 0 to LAB 3 through LAB R respectively. The tails of each segment below the defective row are used to implement the shift. With the first segment $22_{(1)}$, the tail $26_{(1)}$ is used to drive LAB 3. Tail $26_{(2)}$ of segment $22_{(2)}$ is used to drive the redundant LAB R. In this manner, the defective row containing LAB 4 is logically removed from the array. The above arrangement is implemented for each vertical channel 16 in the array below the defective row to implement the redundancy technique across the entire device.

One issue with the aforementioned redundancy scheme is that the tail portion 26 of each segment 22 requires the fabrication of a separate metal trace on the surface of the device. Thus, in this example where the tail extends to every fifth LAB, there is a twenty-five percent (25%) penalty in terms of the number of physical metal trace lines provided on the chip. If there are one hundred (100) logical vertical lines per column, then there needs to be a total of one hundred and twenty five (125) physical interconnect lines per column.

With the present invention, vertical routing segments (e.g. V4 lines) do not have redundancy tails. Each V4 segment and redundancy tail of the prior art is replaced with a V5 segment. The V5 segment has no redundancy tail since its buffer 24 is placed at the very end of the V5 segment, as opposed to the prior art in which the buffer 24 was placed 4 LABs along the length of the V4, with a redundancy tail extending to distance to the fifth LAB.

The method of the present invention is intended to be used on a programmable logic device having a plurality of programmable resources arranged in rows and interconnected by first wire channels running perpendicular to the rows. Second wire channels are also provided on the device running perpendicular to the first wire channels. Each of the first wire channel includes a plurality of wire segments driven by a buffer and spans one or more of the rows. A programmable stitching element is used selectively a first wire segment to the next wire segment in the same wire channel. The method of the present invention generally includes (i) determining if a first wire segment of a first wire channel requires a programmed connection to a resource in the row furthest from the buffer driving the first wire segment and spanned by the first wire segment; (ii) reserving a next segment in the first channel if the first wire segment of the first wire channel requires a programmed connection to a resource in the row furthest from the buffer driving the first wire segment and spanned by the first wire segment; and (iii) assuming a maximum delay path including the programmable signal propagation delay of the reserved next segment and a stitching element coupled between the first segment and the reserved next segment of the first channel. A specific example of the present invention is provided below.

Figure 4:
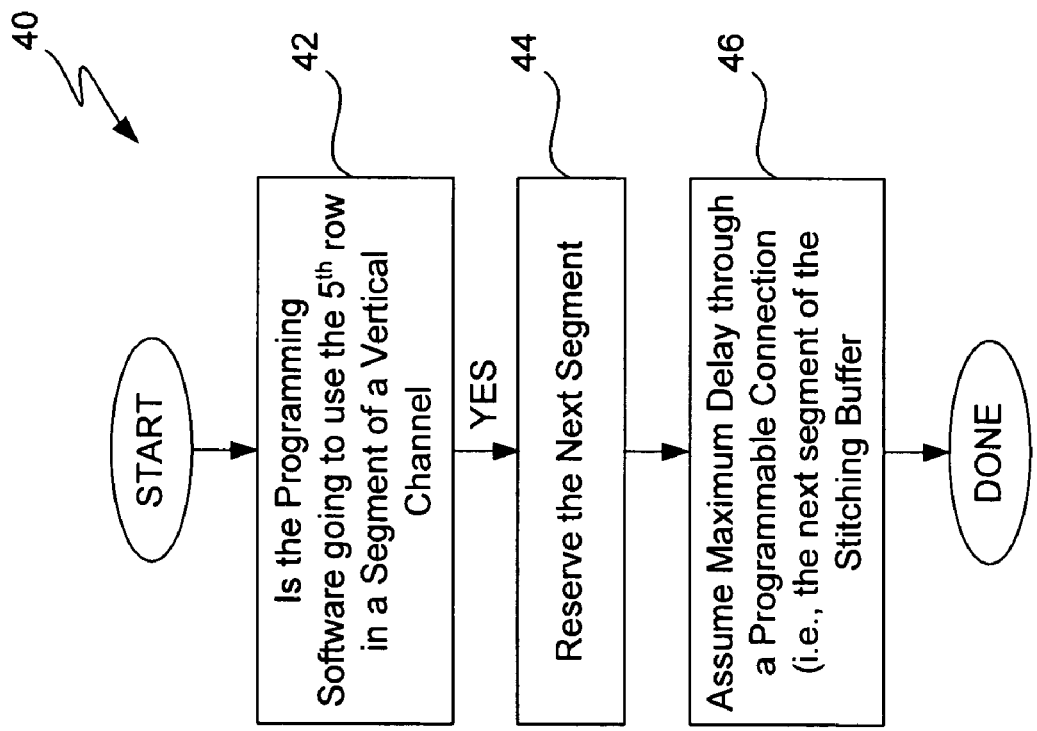
FIG. 4 is a flow diagram illustrating the method of the programming module used to implement redundancy according to the present invention.

The place and route module of the programming software used with the PLDs of the present invention is modified to take advantage of the V5 segment lengths with no redundancy tails. The modifications to the programming software are illustrated in the flow chart 40 of FIG. 4. When the place and route module uses one of the programmable connections in the final row of a V5 segment (box 42), it "stitches" the next V5 segment 22 of the channel 16 using the stitching buffer 24 (box 44). The next V5 segment 22 is thus reserved even if that segment 22 would otherwise be unnecessary to route the signal to any other destination. When the programming software reserves the next V5 segment 22, it automatically assumes that the maximum delay through any of the programmable connection in the final row of the V5 segment is that defined as if the programmable connection were the first corresponding programmable connection of the next V5 segment 22, including the delay through the buffer 24 (box 46).

When redundancy is implemented, the programmable routing data from the defective row is shifted to the neighboring row. This shifts the programming connections for the first four rows to the next row of the V5 segment 22, and shifts the programmable routing data of the last or fifth row of a V5 segment 22 onto the first row of the next or stitched V5 line. The programming data that controls the buffers 24 are not shifted because the stitching of segments 22 is the same in both a repaired and non-repaired device. Thus, a signal that logically feeds the final row of a V5 segment 22 may need to physically pass through a stitching buffer 24 and exist as a programmable connection in the first row of the next V5 segment 22, should redundancy be engaged. Since the software reserved the next V5 segment, just in the case it might be required should redundancy be engaged, the electrical connectivity of the signals are maintained without conflicting with any other routed signal. Further, because the software already assumed that the maximum delay to this final connection already included the delay through the stitching buffer 24, any timing analysis used to verify setup and hold times remains valid when redundancy is implemented.

Thus, with the present invention, it is now possible to use one hundred percent (100%) of the available metal tracks to route long distance signals. In the prior art devices where it was possible to route only four (4) logical channels 16, it is now possible to route five independent channels 16 that run the full height of the device 10. Furthermore, routing a long distance signal now requires going through fewer buffers 24, since the segments 22 span every five (5) LAB instead of four (4).

It should be noted that with the present invention, signals that route a short distance, for example fewer that four LABs, there will be no benefit. However, even in situations where the next V5 segment 22 is reserved, this invention is never less efficient than the prior art. While using the last segment of a V5 track requires the reservation of the next V5 line, the prior art in comparison requires the use of two V4 segments in the same situation.

Figure 5:
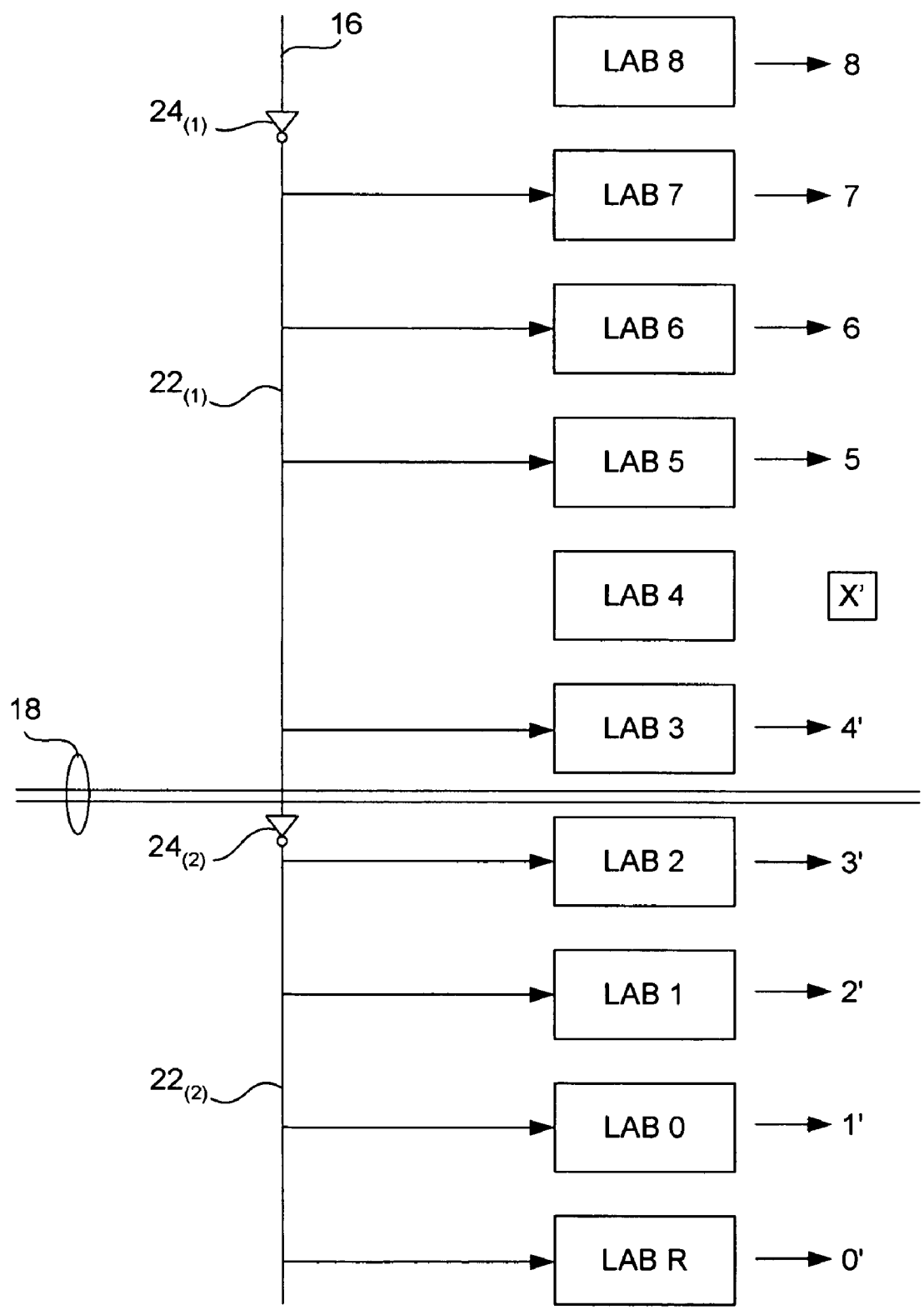
FIG. 5 illustrates how redundancy is implemented on a PLD according to the present invention.

Referring to FIG. 5, an illustration of how redundancy is implemented on a PLD according to the present invention. is shown. In the example shown, segment $22_{(1)}$ spans the array rows designated by LABs 7 through LAB 3. Segment $22_{(2)}$ spans the bottom portion of the array including the array rows designated by LAB 2 through LAB R. The PLD contains a single defective row (i.e., the row containing LAB 4) as designated by the letter "X". The programmable routing data from the defective row is shifted to the neighboring row (i.e., the row containing LAB 3). This shifts the programming connections to for LAB 3 through LAB 0 to LAB 2 through LAB R. of the reserved next segment $22_{(2)}$. The defective row containing LAB 4 is thus r logically removed. Same procedure described above is performed on each vertical channel 16 in the array. In this manner, redundancy is implemented in accordance with the present invention.

When a segment 22 is to be reserved, the corresponding buffer 24 can be activated to drive the previous segment onto the next segment in one of several different ways. When the programming software recognizes that a segment is to be reserved, the software can activate the buffer so that it is always on. Alternatively, the buffer can be turned on only when redundancy is being implemented i.e., the chip is provided with a global redundancy on signal. In a third embodiment, the buffer can be controlled using a configuration bit stored in an associated programming memory cell. With the last embodiment, the configuration bit is set only when the last LAB in a segment is being fed or global redundancy on signal has been set.

Figure 6:
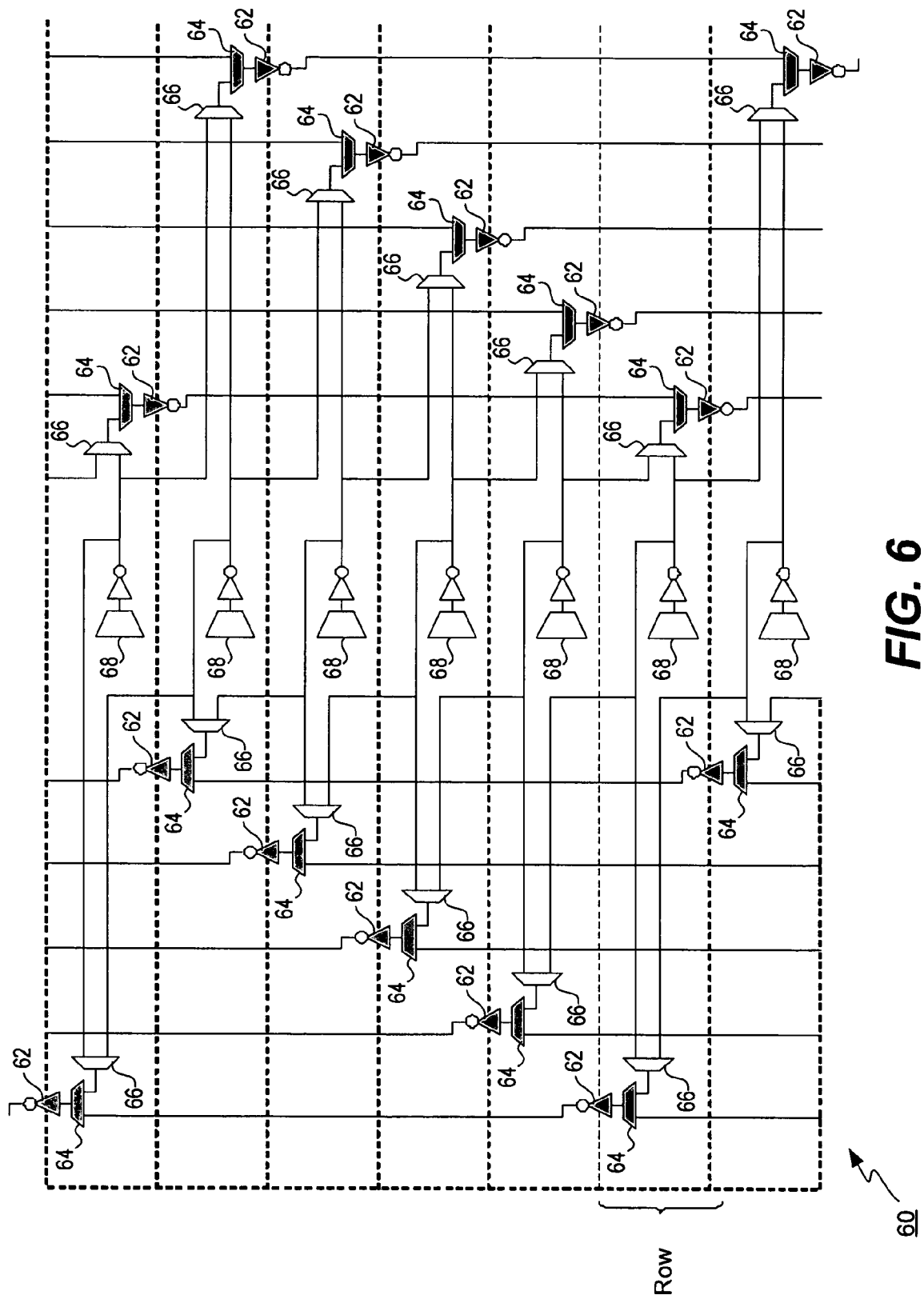
FIG. 6 illustrates a muxing structure for enabling horizontal lines to drive vertical lines according to the present invention.

Referring to FIG. 6, a muxing structure 60 for enabling horizontal lines to drive vertical lines according to the present invention is shown. The muxing structure 60 enables horizontal signals, or outputs from a LAB, to programmably turn onto the driver of a vertical routing segment 22. Each vertical routing segment 22 is driven by a unidirectional driver 62. This driver 62 is fed by a stitching mux 64 that takes an input from either the prior vertical routing segment 22 in the channel 16, or from the output of a "redundancy mux" 66. The redundancy-mux 66 is fed by either the "turn-mux" 68 of the current row, or the "turn-mux" 68 of a prior row. Each turn mux 68 is fed by the horizontal routing segments of its row, or by the outputs of the adjacent LAB in its row. A "turn mux" could also be fed by additional vertical routing segments 22 in order to implement "suboptimal" stitching—the additional connections sometimes being helpful for routing. It should be understood that the discrete stitching, redundancy and turn muxes 64, 66 and 68 as shown are just representative, and could be physically combined into one or more levels of muxing.

The present invention offers a number of advantages over the prior art. Namely, the tails required to implement the prior art redundancy scheme are eliminated. Thus the overhead associated with providing the additional physical metal traces or lines on the chip is eliminated. As a consequence, either the size of the chip having the same number of vertical and horizontal channels can be made smaller, or more physical channels can be added. In another advantage, the segments span five LABs as opposed to four LABs. The number of buffers provided along a segment is therefore fewer, resulting in faster signal propagation times. Lastly, there is no significant performance penalty in using the present invention. With the prior art, a replacement row could not be driven by a horizontal line anyway.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, while the present invention has been described in terms of row redundancy, it also can be implemented using column redundancy. It is therefore intended that the invention be interpreted to include all variations and equivalents that fall within the true spirit and scope of the present invention.

What is claimed is:

1. A method of implementing redundancy on a programmable logic device having a plurality of programmable resources arranged in rows and interconnected by first wire channels running perpendicular to the rows and second wire channels running perpendicular to the first wire channels, each first wire channel including a plurality of wire segments driven by a buffer, each of the wire segments spanning one or more of the rows and stitch-able to a next wire segment in the same first wire channel using a programmable stitching element, the method comprising:
    determining if a first wire segment of a first wire channel requires a programmed connection to a resource in the row furthest from the buffer driving the first wire segment and spanned by the first wire segment;
    reserving a next segment in the first channel if the first wire segment of the first wire channel requires a programmed connection to a resource in the row furthest from the buffer driving the first wire segment and spanned by the first wire segment; and
    assuming a maximum delay path including the programmable signal propagation delay of the reserved next segment and a stitching element coupled between the first segment and the reserved next segment of the first channel.

2. The method of claim 1, further substituting a defective row of logic resources running perpendicular to the first channel with a redundant row of logic resources also running perpendicular to the first channel.

3. The method of claim 2, further comprising shifting programming data intended for the defective row of logic resources to an adjacent row of logic resources also running perpendicular to the first channel.

4. The method of claim 2, wherein the rows of programmable resources run horizontally on the programmable logic device.

5. The method of claim 2, wherein the rows of programmable resources run vertically on the programmable logic device.

6. The method of claim 1, wherein reserving the next segment further comprises activating the programmable stitching element coupled between the first segment and the reserved next segment.

7. The method of claim 6, wherein the activating the programmable stitching element is performed by one of the following:
    (i) maintaining the programmable stitching element always on;
    (ii) setting a global redundancy signal to maintain the programmable stitching element on; or
    (iii) setting a configuration bit to turn the programmable stitching element on.

8. The method of claim 1, wherein the resource consists of one or more of the following types of resources: another logic block, a digital signal processing (DSP) block, a Random Access Memory (RAM) block, or routing resources on the programmable logic device.

9. A computer readable medium for implementing redundancy on a programmable logic device having a plurality of programmable resources arranged in rows and interconnected by first wire channels running perpendicular to the rows and second wire channels running perpendicular to the first wire channels, each first wire channel including a plurality of wire segments driven by a buffer, each of the wire segments spanning one or more of the rows and stitch-able to a next wire segment in the same first wire channel using a programmable stitching element, the medium comprising:
    instructions for determining if a first wire segment of a first wire channel requires a programmed connection to a resource in the row furthest from the buffer driving the first wire segment and spanned by the first wire segment;
    instructions for reserving a next segment in the first channel if the first wire segment of the first wire channel requires a programmed connection to a resource in the row furthest from the buffer driving the first wire segment and spanned by the first wire segment; and instructions for assuming a maximum delay path including the programmable signal propagation delay of the reserved next segment and a stitching element coupled between the first segment and the reserved next segment of the first channel.

10. The medium of claim 9, further instructions for substituting a defective row of logic resources running perpendicular to the first channel with a redundant row of logic resources also running perpendicular to the first channel.

11. The medium of claim 10, further comprising instructions for shifting programming data intended for the defective row of logic resources to an adjacent row of logic resources also running perpendicular to the first channel.

12. The medium of claim 9, wherein the instructions for reserving the next segment further comprises instructions for activating the programmable stitching element coupled between the first segment and the reserved next segment.

13. The medium of claim 12, wherein the instructions for activating the programmable stitching element further comprises instructions for one of the following:
 (i) maintaining the programmable stitching element always on;
 (ii) setting a global redundancy signal to maintain the programmable stitching element on; or
 (iii) setting a configuration bit to turn the programmable stitching element on.

14. The medium of claim 9, wherein the instructions recognizes that the rows of programmable resources run horizontally on the programmable logic device.

15. The medium of claim 9, wherein the instructions recognize that the rows of programmable resources run vertically on the programmable logic device.

16. The medium of claim 9, wherein the resource consists of one or more of the following types of resources: another logic block, a digital signal processing (DSP) block, a Random Access Memory (RAM) block, or routing resources on the programmable logic device.

* * * * *